United States Patent [19]

Iancu et al.

[11] Patent Number: 5,796,631
[45] Date of Patent: Aug. 18, 1998

[54] METHOD AND APPARATUS FOR MONITORING AND CHARACTERIZING POWER QUALITY, FAULTS AND OTHER PHENOMENA IN NETWORK POWER SYSTEMS

[75] Inventors: Daniel S. Iancu, Pleasantville; Christian A. DiFranco, Melville, both of N.Y.

[73] Assignee: Tempo Instrument, Inc., Commack, N.Y.

[21] Appl. No.: 797,136

[22] Filed: Feb. 10, 1997

[51] Int. Cl.[6] .............................. G01R 21/06; H02H 3/26
[52] U.S. Cl. .................... 364/492; 364/483; 364/487; 324/141; 340/663; 307/87; 307/130; 361/63; 361/79; 361/88; 323/210; 323/215; 706/915
[58] Field of Search ........................... 364/483, 492, 364/707, 481, 487; 395/750, 182.13, 182.2, 915; 307/64, 66, 85–87; 361/88, 62, 65, 78–82, 76, 71, 63, 67, 86; 324/141, 537; 340/660, 663, 870.02; 323/210, 215

[56] References Cited

U.S. PATENT DOCUMENTS

| | | |
|---|---|---|
| 3,947,728 | 3/1976 | Smith .......................... 361/76 |
| 4,464,698 | 8/1984 | Yoshizaki ..................... 364/483 |
| 5,070,466 | 12/1991 | Anderson et al. ............. 345/443 |
| 5,160,926 | 11/1992 | Schweizer, III .............. 340/870.02 |
| 5,247,454 | 9/1993 | Farrington et al. ........... 364/492 |
| 5,329,222 | 7/1994 | Guygyi et al. ................ 323/207 |
| 5,465,375 | 11/1995 | Thepaut et al. ............... 395/800.15 |
| 5,499,374 | 3/1996 | Di Giulio et al. ............ 395/728 |
| 5,550,569 | 8/1996 | Wright ......................... 347/15 |

Primary Examiner—Emanuel Todd Voeltz
Assistant Examiner—Cuong H. Nguyen
Attorney, Agent, or Firm—Collard & Roe, P.C.

[57] ABSTRACT

A method and apparatus for receiving, monitoring and characterizing network power information in real time through the use of a specialized display system. A processor receives three phase current and voltage information from a network power relay, converts and scales that data into a two-dimensional vector having coordinates that are represented by, and displayed as, a single pixel on a display screen. The repeated monitoring provides a Feature Map (FM) of the network system that can be easily read and understood by operating personnel.

4 Claims, 4 Drawing Sheets

5,796,631

1

METHOD AND APPARATUS FOR MONITORING AND CHARACTERIZING POWER QUALITY, FAULTS AND OTHER PHENOMENA IN NETWORK POWER SYSTEMS

BACKGROUND OF THE INVENTION

1. Field of the Invention

The present invention relates to power monitoring systems. More particularly, it relates to a method and apparatus used in conjunction with Network Protector Relays for the real time monitoring of power quality, faults and other phenomena in low voltage power grid systems.

2. The Prior Art

Network Protector Relays are used on low voltage power grid systems typically found in urban, commercial and industrial areas. Their function is to detect and isolate faults and other damaging phenomena. When the relay detects a sufficient reverse power condition (i.e., the power flow out of its network), it trips a network protector breaker, disconnecting the power network from its primary feeder and network transformer. Once the relay determines that the power flow would be into the network again, it re-closes the protector breaker.

Digital Signal Processing (DSP) technology has significantly impacted network relaying. DSP provides opportunity for real time monitoring and analysis of low voltage networks, resulting in an increased understanding and characterization of power faults. In addition, it enables the determination of the best functional parameters for the Digital Network Protector Relay (DNPR) at a particular node. This optimizes the relay's control over the power network.

In low voltage networks, monitoring of three phases of voltage and current over long periods of time results in massive amounts of collected data to be analyzed. There is presently no way to analyze this tremendous amount of digital information such that it can be understood easily and effectively.

The systems of the prior art monitor the power network and compare the collected data to a predetermined set of data to evaluate possible faults in the system. These systems do not provide a real time analysis of the collected data, nor do they provide a graphical representation of the collected data in a form that can be easily read and understood by the operator.

SUMMARY OF THE INVENTION

The present invention provides a method and apparatus for monitoring and characterizing power in network power systems.

According to the invention, a first processing device receives three phase current and voltage data from a power network relay, such as, for example, digital network power relay (DNPR) and Distribution Relays. The received three phase current and voltage data is broken down and scaled, either within the DNPR or externally to the DNPR by a programmed computer. The scaling step scales the received n-dimensional data vectors into a predetermined range of values for further processing.

A second processing device, or neural network receives the n-dimensional data vector information from the scaling device or DNPR, and converts it into two-dimensional vectors each having coordinates that represent a pixel on a display device. The neural network can process massive amounts of information and provide two dimensional output vectors representative of the n-dimensional input data. The neural network is a programmable system that is capable of learning based on repeated operations (i.e., identifying patterns in the network performance). In this manner, the neural network can be instructed (programmed) to ignore or overlook occurrences in the monitored power network and only provide an output representative of otherwise abnormal operating conditions.

A display device coupled to the second processing device receives the two-dimensional vector coordinates and displays the pixel corresponding to those coordinates. The repeated occurrence of vector coordinates will be indicated on the display in varying ranges of colors.

The display presents a Feature Map (FM) of the network power system being monitored and provides a graphical visual representation of the power network's current operation.

A further embodiment of the invention includes a memory for receiving the generated two-dimensional vector data and enabling the production of a waveform representative of the data, or in the alternative, a comparison of the received data with other data having predetermined power network characteristics.

It is therefore an object of the present invention to provide a system that can produce a graphical image representing various parameters of a power network monitored over long periods of time.

It is another object of the invention to generate a Feature Map representative of the operating condition of the power network that can be easily read and understood.

It is a further object of the invention to provide a network power relay system that is adaptable for use in any kind of power network monitoring application.

BRIEF DESCRIPTION OF THE DRAWINGS

Other objects and features of the present invention will become apparent from the following detailed description considered in connection with the accompanying drawings which disclose an embodiment of the present invention. It should be understood, however, that the drawings are designed for the purpose of illustration only and not as a definition of the limits of the invention.

In the drawings, wherein similar reference characters denote similar elements throughout the several views.

DETAILED DESCRIPTION OF PREFERRED EMBODIMENTS

Figure 1:
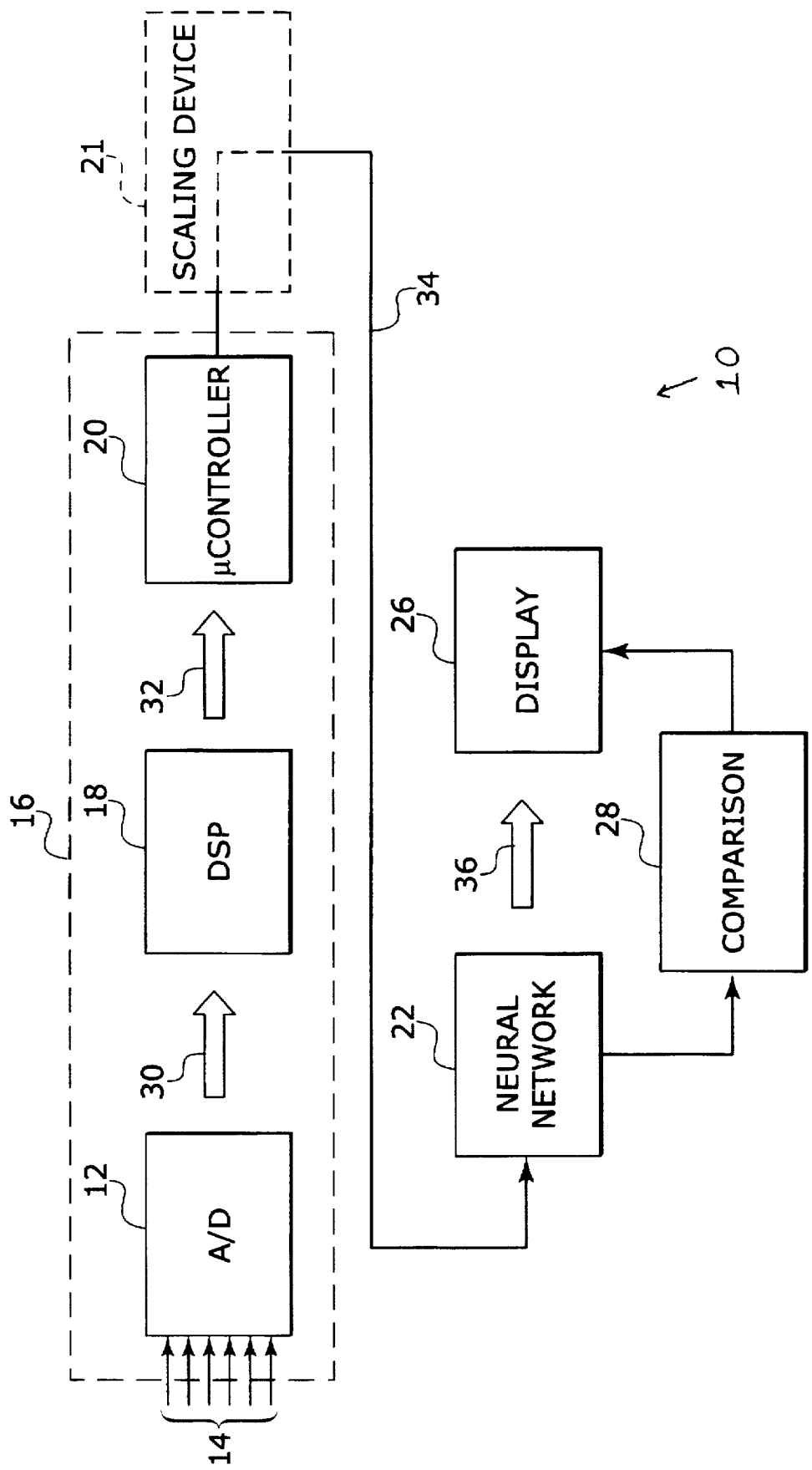
FIG. 1 is a block diagram of the monitoring system according to the invention.

Turning now in detail to the drawings, FIG. 1 shows a block diagram of the system 10 according to the invention. The incoming signal 14 (three phases voltage and current) are input into the Digital Network Power Relay (DNPR) 16 where it is pre-processed by an analog to digital converter (A/D) 12 and transferred to Digital Signal Processor (DSP) 18 via line 30. A/D 12 converts the received analog data into digital data.

The DSP 18 further processes the input data and passes it on to micro-controller 20. An example of the processing of DSP 18 would be calculating RMS values for voltage and current, calculating the phase shift coefficient between the voltage and current, determining distortion factors, for example, FFT coefficients, $V_{rms}$, $I_{rms}$, K %, $\phi_{uf}$, etc. wherein K % is the distortion coefficient, and $\phi_{uf}$ is the phase shift coefficient. Micro-controller 20 scales the processed input data into a n-dimensional vector representative of the input data. Micro-controller 20 can be programmed according to a desired application. The micro-controller 20 receives an n-dimensional vector, such as, for example $|V_{rms}, I_{rms}, K \%, \phi_{uf}|$, and outputs a scaled n-dimensional vector, for example, $|\alpha_1 V_{rms}, \alpha_2 I_{rms}, \alpha_3 K \%, \alpha_4 \phi_{uf}|$, where $\alpha_1$ is the scaling coefficient.

In an alternative embodiment, an external scaling device 21 can be used to scale the processed input data into the n-dimensional data vectors. Scaling device 21 can be any suitable device for scaling data, such as, for example, a computer programmed accordingly.

The scaled n-dimensional vector data information is output along line 34 and input into a neural network 22. Neural network 22 generally resides on a personal computer or other similar type processing system. The neural network 22 is programmed to encode the n-dimensional input vector into a two-dimensional output vector, whose coordinates represent a pixel on display 26. In this manner, one phase cycle is represented by one pixel. The color of the pixel on display 26 is determined by the number of times that specific neuron has been fired in grades of green to red. Any other color scheme or patterns may also be employed without departing from the scope of this disclosure.

Thus, monitoring the network over long periods of time results in a two-dimensional image on display 26. A Feature Map (FM) is ultimately presented on display 26 where the pattern of pixels in the image represent the overall behavior of the particular network location (FIGS. 2a–2f).

For small neural networks, (e.g. 100 by 100 neurons), the power network can be monitored in real time. However, if larger neural networks are required, the power network information must be stored first, and run through the neural network after.

The Feature Map (FM) is a visual display generated based on the unsupervised learning process applications of Kohonen algorithms to the input multi-dimensional vector data. In essence, the Kohonen algorithm consists of employing the following learning rule:

$$\Delta w = \eta \cdot \Lambda(\|r_i - r_i^w\|) \cdot (x_k - w_i) \quad (1)$$

where $\eta$ is the step size in time, and is the time dependent learning parameter, $r_i^w$ is the position of the winner neuron, $x_k$ is the input vector, $w_i$ is the weight factor, and $$\Lambda(\|r_i - r_i^w\|)$$

is the neighborhood function described by:

$$\Lambda(\|r_i - r_i^w\|) = \exp\left( \frac{-\|r_i - r_i^w\|^2}{2 \cdot \sigma^2} \right) \quad (2)$$

and finally, $\sigma^2$ controls the width of the neighborhood.

Figure 3:
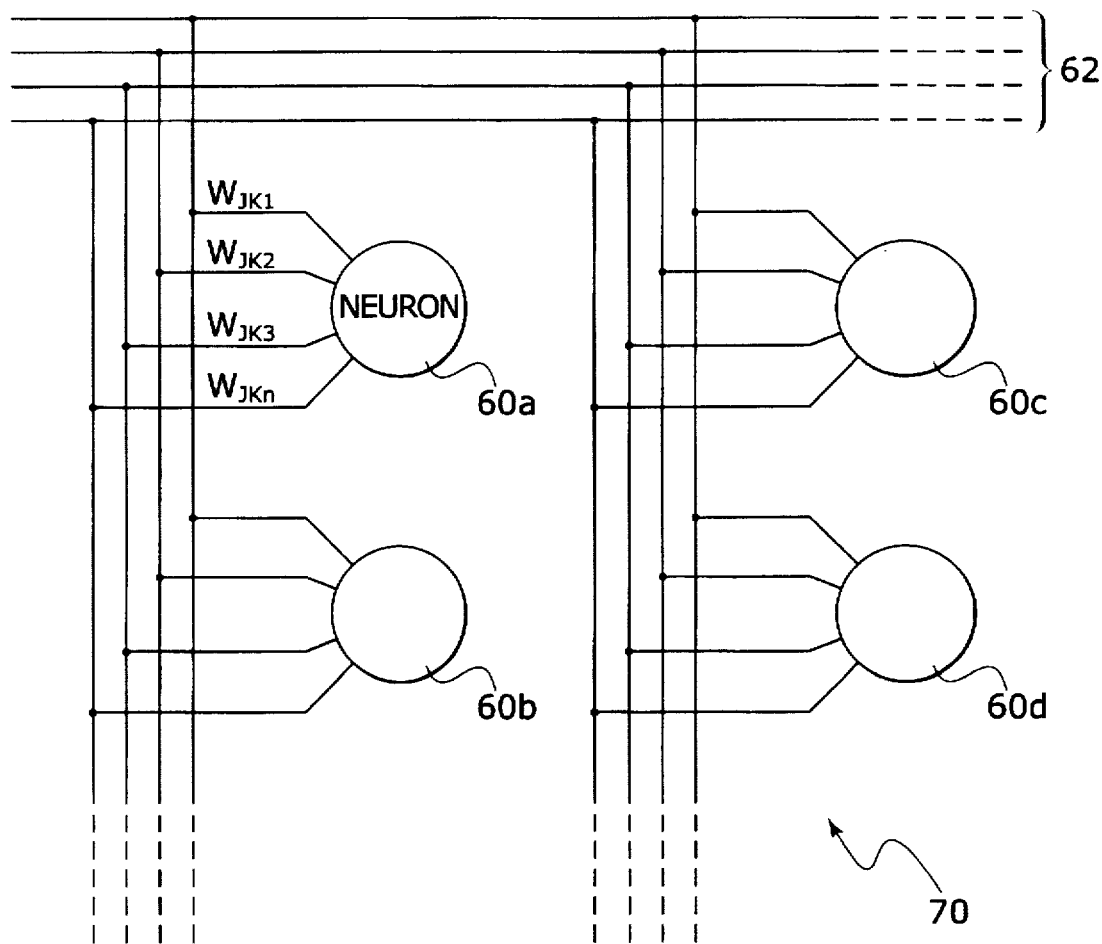
FIG. 3 is a schematic diagram of an example Neural Network according to the invention.

Referring to FIG. 3, the learning process starts by assigning uniformly distributed random numbers to every weight vector $w_i$ in the (n×n) neural network matrix 70, and preparing the set of learning patterns. The generated FM depicts the learning patterns that represent a set of random vectors characterized by a certain distribution function p(x), depending on the application. The learning process can be done either on, or off line, and is done in multiple epochs following two steps: (1) for every input vector, locate the winning neuron; (2) increase the number of matches for this neuron and its topological neighbors, conforming the learning rule and neighborhood function described. The learning is performed until the cost function:

$$S = \sum_{j,k} w_{jk} \quad (3)$$

converges. The summation in the above expression is repeated for all the synaptic weights.

Once the learning is complete, the neural network map (FM) is tested using input vectors different from those used in the learning process. If it turns out that the neural network map does not give satisfactory results, the learning steps must be repeated using a different learning parameter and neighborhood function scheme. Another situation can arise with respect to resolution, which is one of the key factors for a successful neural network. The resolution is directly proportional to the number of neurons in the network. Increasing the number of neurons will also increase the learning time, allocated memory and response time.

The topology of the neural network 22 is depicted by FIG. 3. A single layer of ten thousand neurons arranged in a 100×100 matrix, has been employed for every monitored phase. All neurons 60a, 60b, etc., share the same four input layer inputs 62: RMS voltage, RMS current, Phase angle and distortion factor. The output of every neuron represents a display pixel. Every synaptic weight $w_{klm}$ has been initialized to a uniformly distributed random number.

For learning patterns, a set of random vectors twice as large in number as the number of neurons in the neural network are generated by a computer program. The learning is performed until no significant change in the cost function is observed. During the learning process, $\eta$ was time varying, as large as 0.9 at the beginning and becoming smaller, 0.15 at the end of the learning process, while the width parameter $\sigma$ was kept constant at 0.5. At the end of the learning process, the network, with the final values of weights, was tested against a new batch of random test input vectors, never seen before by the neural network 22.

The Feature Map is correct in the mean square sense, i.e., it gives the best matching for an input pattern in the mean square sense. To build a successful map, all these factors must be taken into account. The best compromise gives the best map.

Neural network 22, utilizing the learning applications of Kohonen algorithms, is capable of learning what information to display. For example, neural network 22 can learn not to record normal monitoring occurrences over periods of time. In other words, neural network 22 will ignore regular or standard operating conditions and process and display random or steadily degrading condition.

FIGS. 2a–2f show test of simulated waveforms of different RMS values, phase and distortion factors in different combinations when applied to the input of a Digital Network Power Relay. The test results show the localization of the position of fired neurons.

Figure 2A:
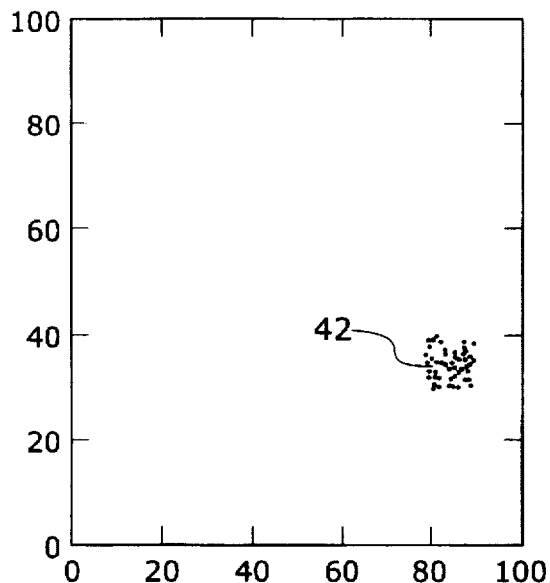
FIGS. 2a–2f are examples of graphical representations of monitored data provided by the system according to the invention.
Figure 2B:
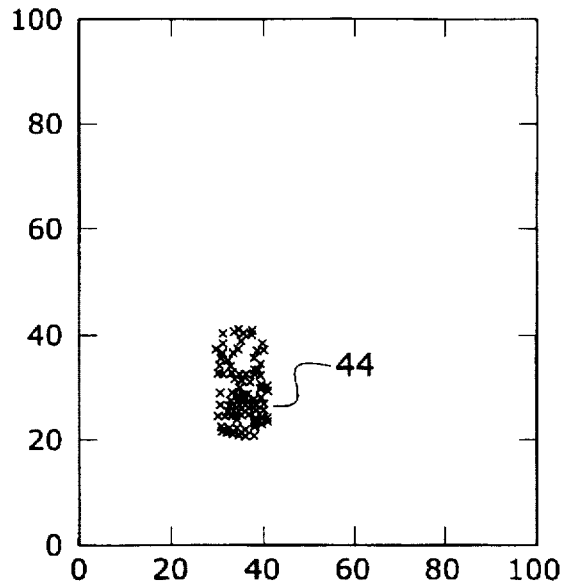

FIG. 2a shows the corresponding area 42 of AC cycles with 0% distortion factor, 120 V RMS with 10 V standard deviation at fixed current (1 A RMS) and phase values (15 degrees). If the current takes different values around a specific value, the points spread over a particular area 44, as shown in FIG. 2b. The results in FIG. 2b come from a current uniformly distributed from 10–20 A RMS.

Figure 2C:
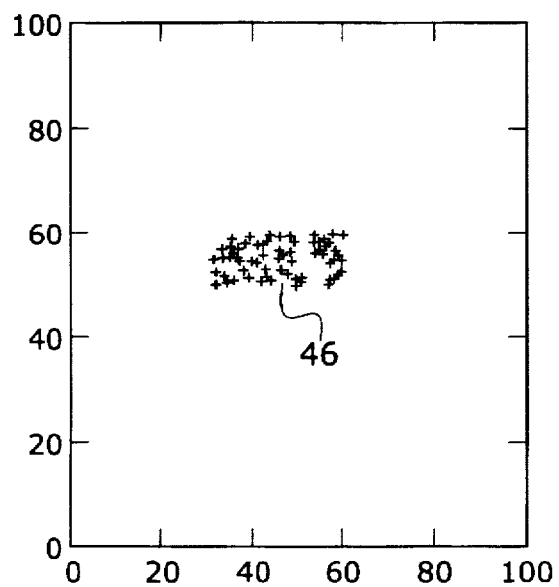
Figure 2D:
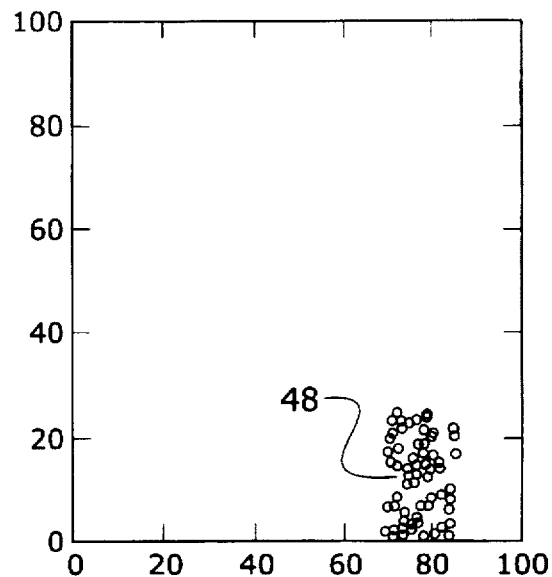

FIG. 2c shows another area 46 characterized by uniform distributed distortion factor (0–10%), fixed current (10 A RMS), voltage (120 V RMS) and phase (15 degrees). FIG.

2d shows an area 48 characterized by uniform distributed phase (0–30 degrees) at fixed current (10 A RMS), voltage (120 V RMS) and distortion factor (0%).

Figure 2E:
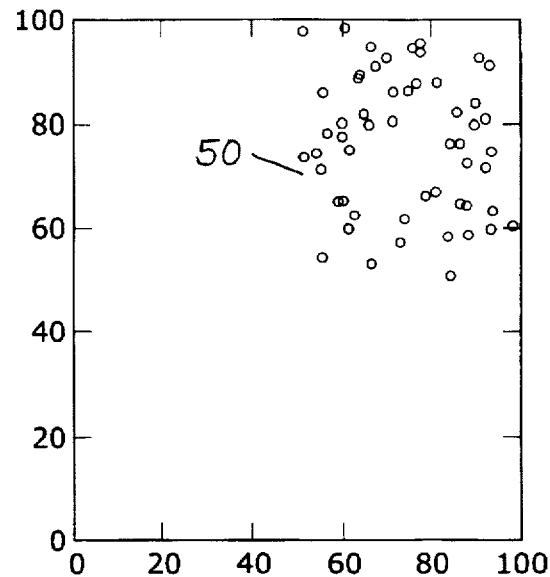
Figure 2F:
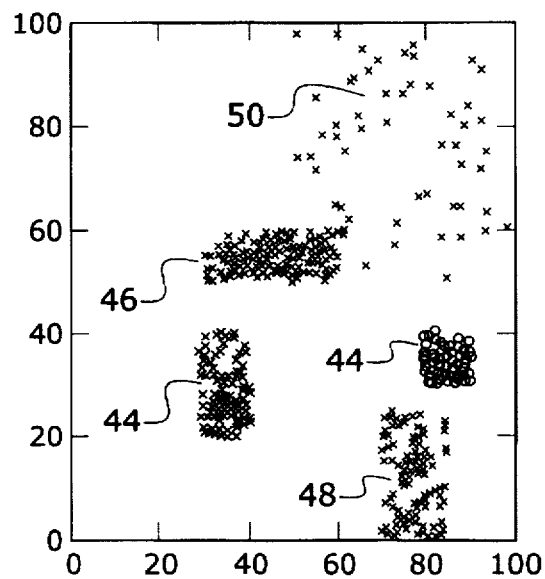

FIG. 2e shows an example of the resulting display when the input parameters are random. Thus, it is clear that there is no pattern to the displayed pixels 50. FIG. 2f shows an FM 50 that represents a combination of the described test results of FIGS. 2a–2e. Recognizing the features of the FM is not simple, however, once we have an understanding of the different areas of interest, the power quality, faults, and other phenomena can be easily identified and characterized. For purposes of simplicity, this map 50 describes only a few features of a power network. In true applications, the FM will be much more complex.

To further clarify the understanding of the generated FM, colors are added to the map to more clearly depict particular areas of activity.

Another method of recognizing particular features learned by the Neural Network is to perform enforced learning. This process is primarily the same, but instead of starting with random weights and patterns, start with quasi random weights, i.e., we place "seeds" of desired patterns in certain determined places in the map and start the learning with those seed patterns. This performs the correlation of neurons around the seeds first and continue to do it with random patterns until no significant change in the cost function is observed.

While one embodiment of the present invention have been shown and described, it is to be understood that many changes and modifications may be made thereunto without departing from the spirit and scope of the invention as defined in the appended claims.

What is claimed is:

1. A method for monitoring power in network power systems comprising the steps of:

receiving voltage and current data from a power network including receiving three phase voltage and current data from a network protector relay;

processing and converting the received data into n-dimensional vectors representative of the received data;

scaling the n-dimensional vector information to be input into a processing device; and converting the scaled n-dimensional vector information into two-dimensional vector information having coordinates representing a pixel on a display screen.

2. The method according to claim 1, wherein said step of displaying includes the step of generating a Feature Map representing the current operating condition of the power network.

3. An apparatus for monitoring and characterizing power in network power systems utilizing power distribution relays comprising:

a digital signal processor having an input adapted to receive three phase current and voltage data from the distribution relay and an output; and a micro-controller having an input coupled to said output of said digital signal processor and an output, said micro-controller being adapted to scale and convert the three phase current and voltage data into n-dimensional vectors representative of said input data;

a neural network adapted to receive, process and convert the n-dimensional vector data into two-dimensional vectors, wherein each of the generated two-dimensional vectors has coordinates representative of a pixel; and a display device coupled to said neural network and arranged to display the two-dimensional vector data of the voltage and current data.

4. An apparatus for monitoring and characterizing power in network power systems utilizing power distribution relays comprising:

signal processing means having an input for receiving the three phase current and voltage data from the power network, and an output;

scaling means having an input coupled to said output of said signal processing means for scaling and converting the three phase current and voltage data into n-dimensional vectors representative of said input data;

a neural network adapted to receive and convert the n-dimensional vector data into two-dimensional vectors, wherein each of the generated two-dimensional vectors has coordinates represented by a pixel; and display means coupled to said neural network for displaying the two-dimensional vector data of the voltage and current data.

* * * * *